United States Patent [19]

Jongepier

[11] Patent Number: 4,918,379
[45] Date of Patent: Apr. 17, 1990

[54] INTEGRATED MONOLITHIC CIRCUIT HAVING A TEST BUS

[75] Inventor: Abraham Jongepier, Eindhoven, Netherlands

[73] Assignee: U.S. Philips Corp., New York, N.Y.

[21] Appl. No.: 239,090

[22] Filed: Aug. 31, 1988

[30] Foreign Application Priority Data

Feb. 16, 1988 [NL] Netherlands ............... 8800374

[51] Int. Cl.[4] ............................................. G01R 31/28
[52] U.S. Cl. ................................. 324/73.1; 371/25.1
[58] Field of Search .............. 324/73 R; 371/25, 20, 371/25.1, 20.1

[56] References Cited

U.S. PATENT DOCUMENTS

| | | | |
|---|---|---|---|
| 4,339,819 | 7/1982 | Jacobson | 324/73 R |
| 4,701,921 | 10/1987 | Powell et al. | 371/25 |
| 4,701,922 | 10/1987 | Kuboki et al. | 324/73 R |
| 4,810,958 | 3/1989 | Mogi et al. | 324/73 R |

Primary Examiner—Ernest F. Karlsen
Attorney, Agent, or Firm—Steven R. Biren

[57] ABSTRACT

For the testing of an integrated monolithic circuit (IC) the integrated monolithic circuit with a test bus which extends along a functional part of the circuit which is partitioned into macro circuits and which is coupled to the macro circuits, each macro circuit comprising a test interface circuit which is connected in series with test interface circuits of the other macro circuits; via the test interface circuits, the macro circuits can be coupled to the test bus. As a result, macro circuits can be separately tested and in the case of a hierarchic design of integrated circuits, utilizing previously designed marco circuits and test programs for previously designed macro circuits, test development times can be substantially reduced; this is an increasingly important aspect of increasingly complex circuits.

9 Claims, 4 Drawing Sheets

INTEGRATED MONOLITHIC CIRCUIT HAVING A TEST BUS

BACKGROUND OF THE INVENTION

The invention relates to an integrated monolithic circuit having a predetermined internal structure and comprising a functional circuit which is partitioned into at least two macro circuits and test interface circuits which are coupled to the macro circuits, the functional circuit being coupled to external connections and the test interface circuits being coupled to one another.

An integrated monolithic circuit of this kind is described in an article by Beenker et al. "Macro Testing" in *IEEE DESIGN* & TEST, Dec. 1986, pp. 26–32. The article by Beenkez et al proposes the partitioning into macro circuits for the testing of a digital circuit, being either an integrated monolithic circuit or a circuit consisting of a number of integrated monolithic circuits which are grouped on a board so as to form a digital circuit, a macro circuit being related to a partitioning into building blocks (such as RAM (random access memory), ROM (read-only memory), multipliers and ALU (arithmetic and logic unit)) which is customarily used for VLSI (very large scale integration) design methods. The digital circuit as a whole forms a functional circuit. When the digital circuit is accommodated in one integrated monolithic circuit, it is coupled to external connections of the integrated monolithic circuit. Via test interface circuits (see inter alia FIG. 3 of the cited article), inputs and/or outputs of the macro circuits are accessible for test purposes. A method of coupling as described in said article on page 30 is the coupling of the test interface circuits so as to form a shift register. Under the control of a clock signal, predetermined data is shifted into the shift register. Correct operation of the functional circuit can be verified by analysis of the data shifted out of the shift register. The nature of digital circuits is suited to such a method of testing. The correct operation of a digital circuit can be verified on the basis of the analyzed data which thus may become available (many) clock periods later than the applied data. Such a method of testing, however, is not suited to the testing of a (mainly) analog functional circuit. In the case of an analog circuit the response to an input signal is virtually immediately (real time) available as the output signal which cannot be stored in, for example a flip flop such as in the case of digital macro circuits (combinatory, sequential or a combination thereof). The macro circuits of an analog functional circuit will usually be highly interrelated (real time). Furthermore, for each new design the proposed method of testing, using additional hardware added to the integrated monolithic circuit for test purposes, makes it necessary to determine the method of coupling the macro circuits to the test interface circuits completely a new, together with the associated test software, during the design phase of the integrated monolithic circuit. A strong relationship exists between the design of the functional and the additional hardware and the test software to be generated.

SUMMARY OF THE INVENTION

It is the object of the invention to provide an integrated monolithic circuit which comprises simply structured additional hardware for test purposes and which does not have the said drawbacks.

To achieve this, an integrated monolithic circuit in accordance with the invention is characterized in that the integrated monolithic circuit comprises a test bus which can be coupled to the macro circuits and also comprises coupling means which can be controlled by the test interface circuit in order to couple the test bus to at least one input and/or output of the macro circuit, the test bus being coupled to additional external connections and/or is multiplexed with the external connections of the functional circuit. It is thus achieved that each macro circuit of the functional circuit can be separately and real-time tested. When the macro circuit is, for example an oscillator circuit, it will be sufficient to observe only the output via the test bus; for example, when an amplifier circuit is concerned, it will be necessary to connect the input as well as the output to the test bus. For example, in the case of suitable partitioning a test bus comprising three conductors can be chosen, which is usually sufficient. In that case three inputs and/or outputs of a macro circuit can be connected to the test bus for analysis. If it is not objectionable to provide the integrated monolithic circuit with additional connections, the test bus can be connected to the additional connections. Otherwise the conductors of the test bus can be multiplexed, partly or wholly, with connections of the functional circuit. The integrated monolithic circuit in accordance with the invention offers the major advantage that, when previously designed macro circuits are added to the functional circuit, previously generated test programs can be used for testing the previously designed macro circuits. It is only necessary to generate test programs for new macro circuits to be included in the functional circuit. The total design and test time is thus substantially reduced. Moreover, different designers can simultaneously generate test programs for different macros. Once test programs have been generated for macro circuits, they can be stored on record carriers for later use for the testing of new designs of functional circuits.

An embodiment of an integrated monolithic circuit in accordance with the invention is characterized in that the test interface circuit comprises at least one control flipflop for controlling the coupling means, the control flipflops of the test interface circuits being coupled to one another, the coupled flipflops being connected to a data input and to a clock input which are connected to further external connections and/or are multiplexed with the external connections of the functional circuit and/or with the additional external connections. Data presented to the control flipflops via the data input under the control of a clock signal on the clock input selects of the macro circuit or the macro circuits, i.e. the macro circuit or macro circuits to be connected to the test bus.

A further embodiment of an integrated monolithic circuit in accordance with the invention is characterized in that the control flipflops are coupled so as to form a shiftregister circuit, an input of the shiftregister circuit being connected to the data input, and outputs of the shiftregister circuit being connected to the coupling means. By clocking in a signal having a first level on the data input and by subsequently clocking in signals having a second level on the data input, it is achieved that the macro circuits are successively connected to the test bus.

A further embodiment of an integrated monolithic circuit in accordance with the invention is characterized in that the coupling means comprise switches for switching the at least one input and/or output of the macro circuit to the test bus, the coupling means also comprising switch control means which are coupled to the test interface circuit and the switches. When the coupling means are activated by the control means, the switches connect inputs and/or outputs of the macro circuit to the test bus.

An input of an analog macro circuit cannot always be connected to the test bus directly by means of the coupling means. For example, when a macro circuit comprises a differential amplifier input stage, in given circumstances (for example, a sensitive, low-noise input stage) no additional hardware may be directly coupled to the inputs of the input stage in order to prevent the operation of the macro circuit from being disturbed in the normal mode. An embodiment of an integrated monolithic circuit in accordance with the invention in which the functional circuit comprises a macro circuit comprising a differential amplifier input stage is characterized in that the coupling means comprise an additional differential amplifier stage with outputs connected parallel to the differential amplifier input stage, and also comprise a switching device which can be controlled by the test interface circuit and which is inserted in a tail of the differential amplifier stages, which switching device serves to connect the differential amplifier input stage and the additional differential amplifier stage to a part of the macro circuit to be controlled by the differential amplifier input stage, an input of the additional differential amplifier stage being connected to the test bus. As a result, during testing the test signal will not enter the macro circuit via the differential amplifier input stage but rather via an additional differential amplifier stage. The differential amplifier stage itself should then be tested, for example in an overall test of the integrated monolithic circuit.

An embodiment of an integrated monolithic circuit in accordance with the invention is characterized in that the test interface circuit comprises an enable circuit having an input which is connected to an output of the control flipflop and an enable input which is connected to an output of a comparison circuit which is common to the test interface circuits and which comprises a reference input for the supply of a reference signal and an input which is connected to the clock input for the supply of a tri-valent clock signal, an output of the enable circuit being connected to the coupling means in order to enable the coupling means. It is thus achieved that the control flipflops can first be supplied with data in a predetermined manner, without a macro circuit being coupled to the test bus. When the clock signal has a first and a second level, the control flipflops receive data via the data input. Via comparison with a reference signal on the reference input, the comparison circuit is switched over in the case of a third level of the clock signal, so that all macro circuits whose appropriate control flipflop provides the appropriate indication are coupled (preferably one at a time) to the test bus.

An integrated monolithic circuit in accordance with the invention in which at least one of the macro circuits is a digital circuit is characterized in that in the test mode the coupling means are controlled so that sequential logic circuits of the digital circuit are connected in series and combinatory logic circuits of the digital circuit are connected in an input/output relation with the sequential logic circuits, the series connection comprising a data input for the supply of data and a data output for the output of data to and from the digital circuit, the data input and the data output being connected to the test bus. Via the test bus a digital macro circuit of this kind can be tested by means of a so-called scan test. Scan testing itself is described in detail in the cited article by Beenkez et al. For a given design the Boolean formula of the combinatory circuits is known. The sequential circuits can assume a variety of internal states. Using the scan test, the combinatory circuits are separated by additional hardware during the testing of the series connected sequential circuits, the combinatory circuits then being in an input/output relation with the sequential circuits. By applying data to the series connection and by analyzing data shifted out of the series connection, the correct operation of the digital circuit can be verified.

BRIEF DESCRIPTION OF THE DRAWING

The invention will be described in detail hereinafter with reference to a drawing, in which.

DESCRIPTION OF THE PREFERRED EMBODIMENTS

Figure 1:
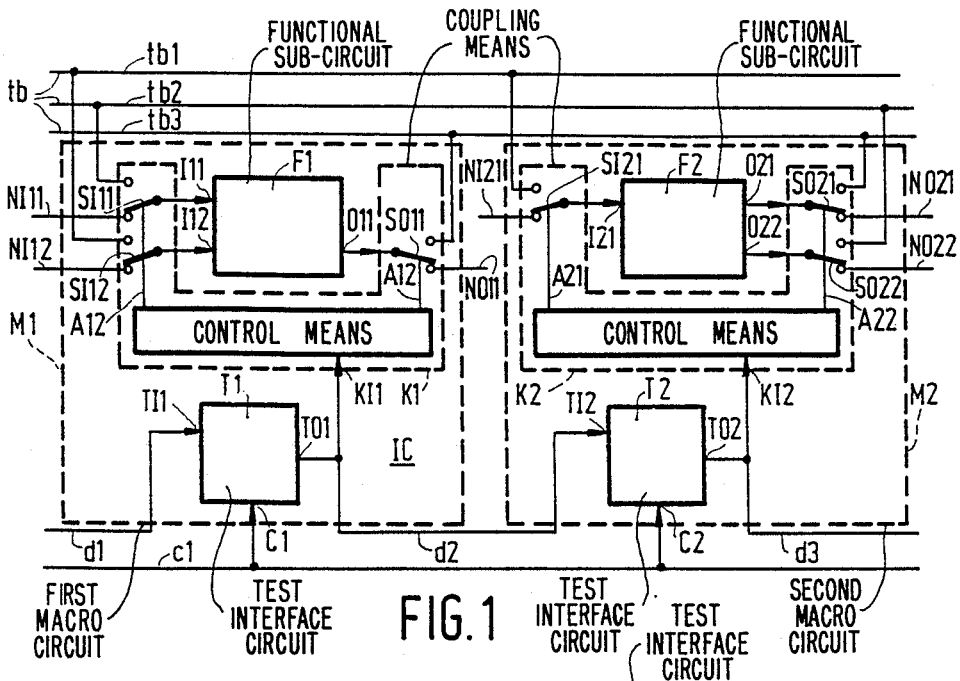
FIG. 1 diagrammatically shows a part of an integrated monolithic circuit in accordance with the invention.

FIG. 1 diagrammatically shows a part of an integrated monolithic circuit IC in accordance with the invention; the references M1 and M2 denote a first and a second macro circuit, respectively, comprising respective coupling means K1 and K2 and test interface circuits T1 and T2. The test interface circuit T1 comprises an input TI1 which is connected to a data line d1. A clock input C1 and an output TO1 of the test interface circuit T1 are connected to a common clock line c1 and to a data line d2, respectively. The test interface circuit T2 comprises an input TI2, a clock input C2 and an output TO2 which are coupled to a data line d2, the clock line c1 and a data line d3 in a similar way as T1. The coupling means K1 and K2 are coupled, by way of an input KI1 and KI2, to the outputs TO1 and TO2. The coupling means K1 comprise control means A11 and A12 for controlling switches SI11, SI12 and SO11. The coupling means K2 similarly comprise control means A21 and A22 and switches SI21, SO21 and SO22. When the coupling means K1 are activated by the test interface circuit T1, the switches SI11, SI12 and SO11 switch over inputs I11, I12 and output O11 of a functional sub-circuit F1 from normal mode inputs NI11 and NI12 and normal mode output N011 to the test mode on test lines tb1, tb2 and tb3 of a test bus tb. In the normal mode the coupling means are connected so that the test interface circuit is transparent, i.e. the macro circuit is coupled to other macro circuits in a manner determined by the design of the integrated monolithic circuit. In the test mode the macro circuit is uncoupled from other macro circuits and can be tested via the test bus. The control of the macro circuit M2, comprising a functional sub-circuit F2, inputs I21, NI21 and outputs 021, N021, N022, is identical to the control of the macro circuit M1. The integrated monolithic circuit usually comprises a large number of functional sub-circuits (macro circuits) which are all coupled to the test bus in the manner shown. Evidently, in the normal mode the macro circuits are coupled to one another in a manner determined by the design of the integrated monolithic circuit, via normal mode inputs NIxx and outputs NOxx. In the test mode, for example each time one macro circuit is connected to the test bus. The switches and coupling means, being diagrammatically shown, can be constructed in various ways, depending on the type of IC. The switches may be, for example controlled bipolar switches and the drive means may also be constructed in bipolar technology. MOS technology is also feasible or an integrated technology based on light signals. The test interface circuits T1 and T2 may be flipflops coupled so as to form a shift register. Via the data line d1 a bit pattern can then be shifted into the shift register circuit. The state of the output TOxx of a control flipflop Tx then determines whether a macro circuit is in the test mode. A series connection of test interface circuits is to be preferred, because the smallest number of interconnection lines is then required. Examples of controllable electronic switches comprising control means can be found inter alia in a manual such as "Operational Amplifiers", Greame et al, McGraw-Hill 1971, ISBN 07-064917-0, pp. 328-335, which shows multiplexers. For the design of integrated monolithic circuits an increasing use is made of hierarchic design methods where the designer can utilize previously designed macro circuits stored on a storage medium such as a magnetic disc or tape. When the partitioning of an integrated monolithic circuit is compatible with the hierarchic design, the time required for developing test programs can be substantially reduced. Test programs can even be at least partly automatically generated. The test programs should be such that it is not only verified whether a macro circuit operates correctly or not, but also that an idea is obtained as regards the fault behaviour.

Figure 2A:
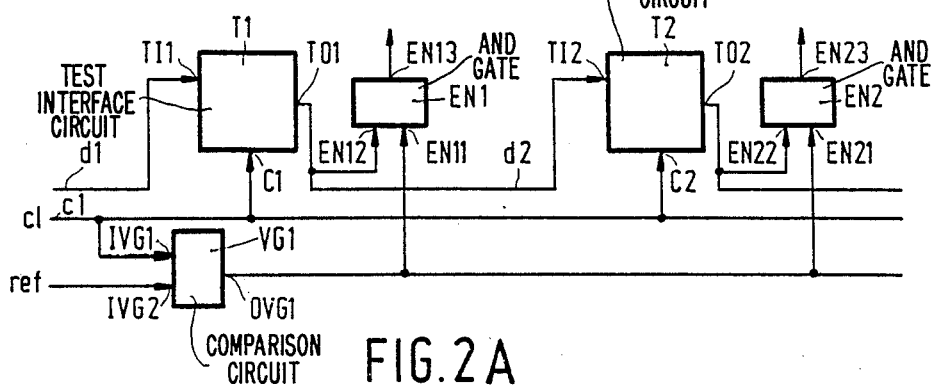
FIG. 2A shows a version of a test interface circuit in an integrated monolithic circuit as shown in FIG. 1.

FIG. 2A shows a version of a test interface circuit as shown in FIG. 1, elements and signals corresponding to FIG. 1 being denoted in the same way as in FIG. 1. A comparison circuit VG1 comprises, connected to the clock line c1 an input IVG1 and an input IVG2, for the supply of a reference signal ref. An output OVG1 of the comparison circuit VG1 is connected to an input EN11 of an AND-gate circuit EN1; an input EN12 is connected to the output T01. Similarly, an AND-gate circuit EN2, comprising inputs EN21 and EN22, is connected to outputs OVG1 and T02. An output EN13 of the AND-gate circuit EN1 is connected to the input KI1 of the coupling means K1 and an output EN23 is connected to the input KI2.

Figure 2B:
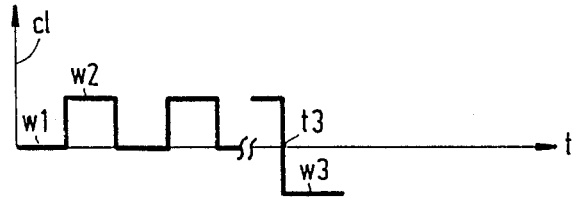
FIG. 2B shows a tri-valent clock signal for supply to a test interface circuit as shown in FIG. 2A in order to illustrate the operation thereof.

The operation of this version of the test interface circuit as shown in FIG. 2A will be illustrated on the basis of FIG. 2B in which a tri-valent clock signal cl for supply to the clock line c1 is shown as a function of the time t. When the clock signal cl has a first value w1 or a second value w2, the control flipflops T1, T2, ... can be loaded without the coupling means of the macro circuits being activated by way of the outputs EN13, EN23. This is because the reference signal ref is chosen so that the comparison circuit sets all AND-gate circuits to a non-active state for the coupling means K1, K2, .... When the clock signal cl assumes a third value w3 at the instant t3, the output OVG1 of the comparison circuit changes it state and, via the AND-gate circuits EN1, EN2, ..., the output signals on the outputs T01, T02, ... are applied to the coupling means K1, K2, .... Thus, during the testing of an integrated monolithic circuit it can be ensured that all macro circuits are set to the same mode, regardless of the state of the control flipflops. This mode will preferably be the normal mode. There are alternatives for ensuring that the circuit is set to the normal mode when it is switched on. For example, an additional reset line can be added for all control flipflops or use can be made of control flipflops which all assume the same defined state after the switching on of the supply voltage.

Figure 3:
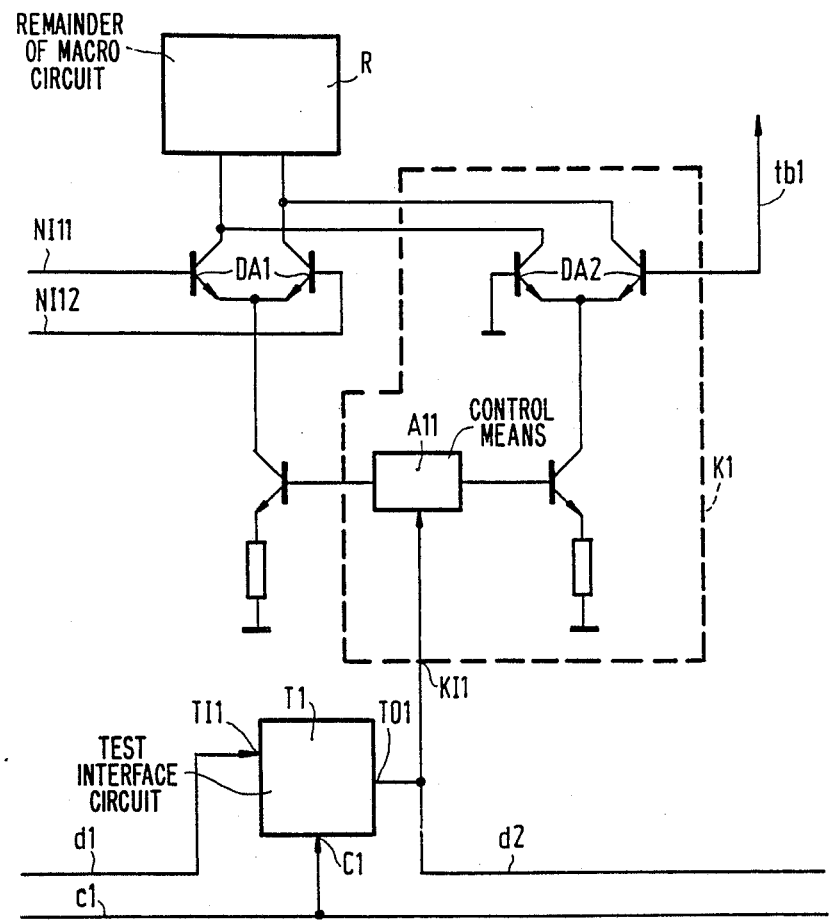
FIG. 3 shows a macro circuit comprising a differential amplifier input stage with a test interface circuit coupled thereto via coupling means.

FIG. 3 shows a macro circuit comprising a differential amplifier input stage DA1 with a test interface circuit coupled thereto via coupling means K1. Elements and signals corresponding to FIG. 1 are denoted by corresponding references. The reference R denotes the remainder of the functional pair of the macro circuit. An additional differential amplifier stage 0A2 is connected parallel to the differential amplifier input stage 0A1. Control means A11 for connecting DA1 to the normal mode inputs NI11 and NI12 and for connecting DA2 to the test mode input tb1 are controlled by the control flipflop T1. In the test mode the remainder R of the macro circuit is tested. The differential amplifier input stage DA1, whose inputs NI11 and NI12 are not connected to additional test hardware, is not tested. The differential amplifier input stage DA1 must be tested in a general, more or less "pass/fail" test of the integrated monolithic circuit.

Figure 4:
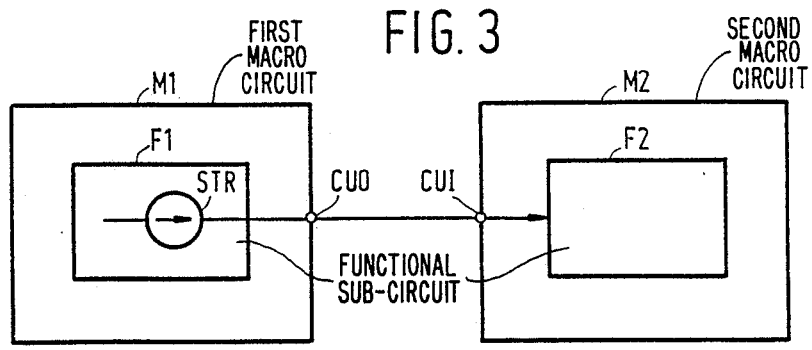
FIG. 4 shows a first macro circuit with a second macro circuit coupled thereto, a current output of the first macro circuit being connected to a current input of the second macro circuit.

FIG. 4 shows a first macro circuit M1 with a second macro circuit M2 coupled thereto, the first macro circuit M1 being coupled, by way of a current output CUO, to a current input CUI of the second macro circuit M2. The macro circuits M1 and M2 comprise functional subcircuits F1 and F2. When the macro circuit M2 is set to the test mode, a current STR must be drained from the macro circuit M1; when the macro circuit M1 is set to the test mode, the additional hardware should include means for applying the current STR to the test bus.

Figure 5:
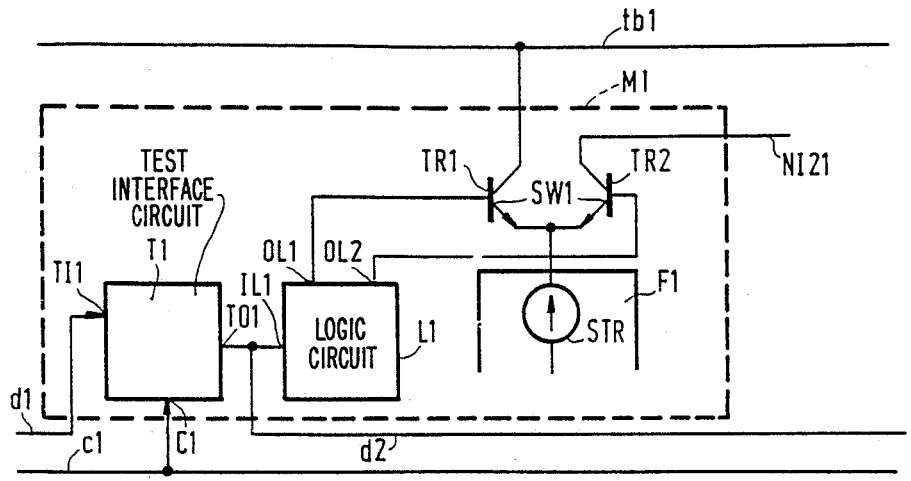
FIG. 5 shows the first macro circuit of FIG. 4, comprising means for coupling to the test bus.
Figure 6:
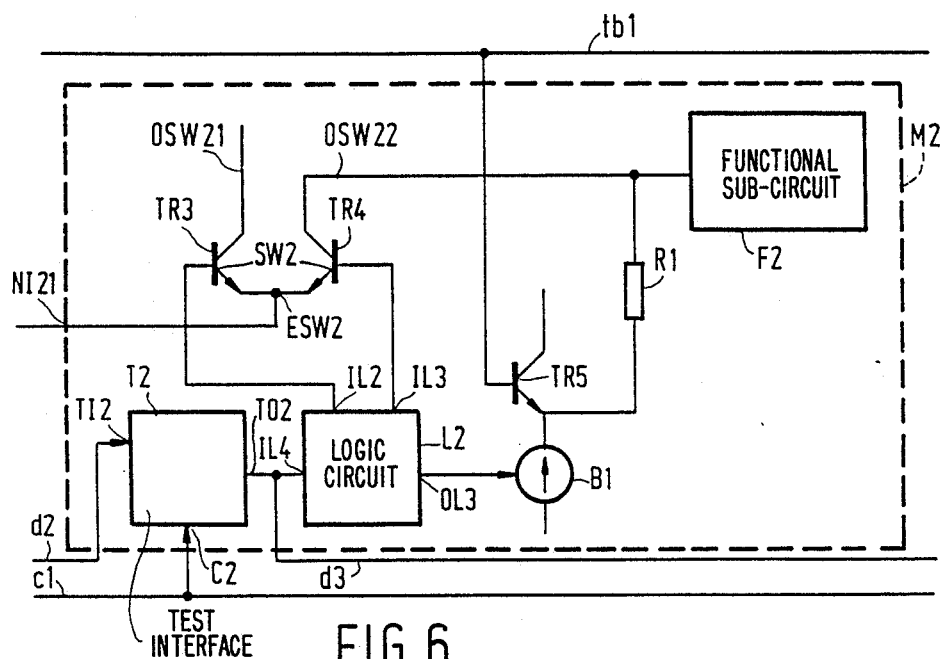
FIG. 6 shows the second macro circuit of FIG. 4, comprising means for coupling to the test bus.

For the solution of such problems, FIG. 5 shows the first macro circuit and FIG. 6 shows the second macro circuit, comprising means for coupling to the test bus. Elements and signals corresponding to FIG. 1 are again denoted as in FIG. 1.

The reference L1 in FIG. 5 denotes a logic circuit which is connected, by way of an input IL1, to the output T01 of the control flipflop T1. Via outputs OL1 and OL2, L1 controls a current switch SW1. A current source STR is a current output of the functional part F1. In the test mode the current STR must be applied to the test line tb1. In the test mode a transistor TR1 is conductive and a transistor TR2 is blocked under the control of the logic circuit L1. As a result, the current STR is applied to the test line tb1 instead of to NI21. The reverse takes place in the normal mode.

In FIG. 6 a current switch SW2, comprising transistors TR3 and TR4, is connected to inputs IL2 and IL3 of a logic circuit L2. Outputs OSW21 and OSW22 are connected to a fixed potential and to the functional subcircuit F2, respectively, of the macro circuit M2. An output current STR of the macro circuit M1 (not shown) is applied to a common point ESW2 of the current switch SW2. The logic circuit L2 is coupled, by way of an input IL4, to the control flipflop T2; an output OL3 controls a controllable current source B1 which is connected to the test line tb1 via a transistor TR5. The current source B1 is also coupled to the functional sub-circuit F2, via a resistor R1. In the normal mode, L2 renders the transistor TR4 conductive and the transistor TR3 is blocked. Moreover, the current source B1 is disconnected. The normal mode input NI21 is then coupled to F2. In the test mode TR3 is conductive, TR4 is blocked and B1 is connected. As a result, the current STR of the macro circuit M1 is drained via the transistor TR3. In the test mode the functional part F2 receives a current which is determined by the voltage on the test line tb1 divided by the resistor R1 (TR5 operates as an emitter-follower) and which current is independent of the current STR of the macro circuit M1.

Figure 7:
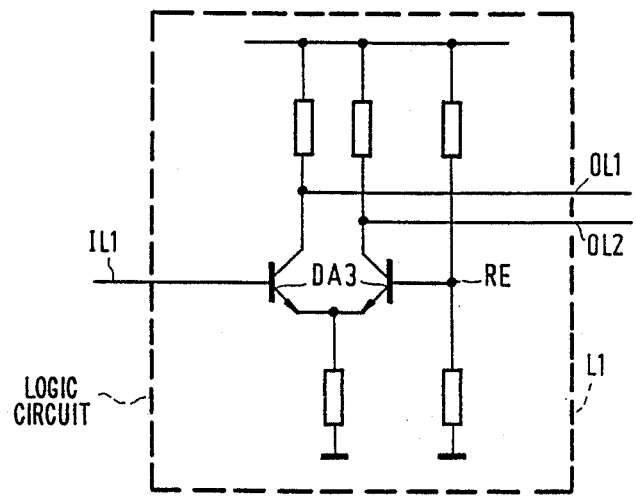
FIG. 7 is a more detailed representation of the coupling means shown in FIG. 5.

FIG. 7 is a more detailed representation of the coupling means shown in FIG. 5, that is to say of the logic circuit L1. Depending on the logic level on the input IL1, either the input OL1 or the output OL2 is activated in the differential amplifier OA3 connected to a reference potential on an input RE.

Figure 8:
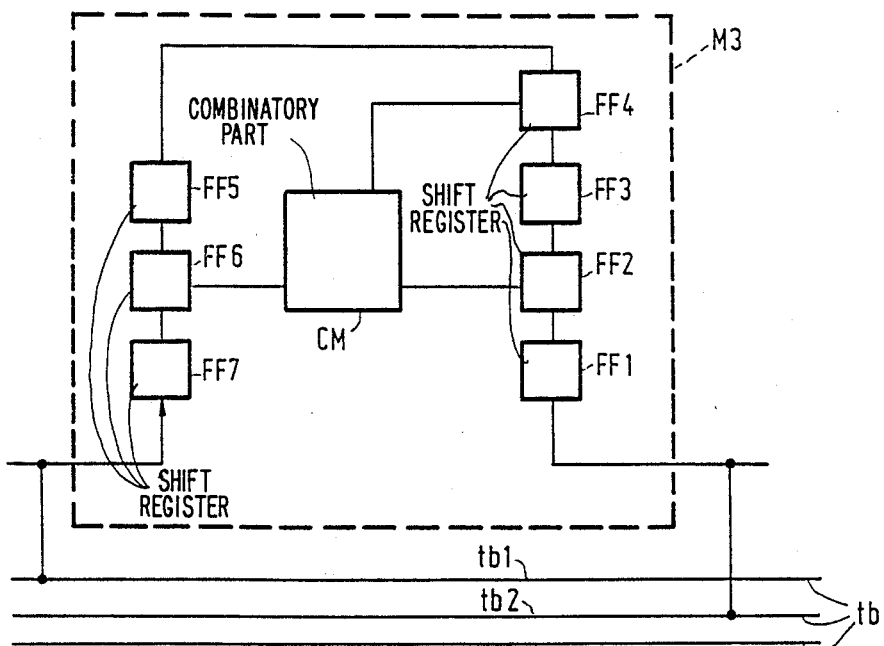
FIG. 8 shows a digital macro circuit coupled to the test bus during a scan test.

FIG. 8 shows a digital macro circuit in a test mode in which it is coupled to the test bus during a scan test. The sequential part is accommodated (by means of additional hardware not shown) in the shift register configuration (FF1, FF2, . . . , FF7) and the combinatory part CM, whose Boolean formula is known entertains an input/output relation with respect thereto. This mode is known as the scan test. The input and the output of the shift register (FF1, FF2, . . . , FF7) are tested in known manner via the test lines tb1 and tb2.

It is to be noted that in the user mode of the integrated monolithic circuit the test lines should be low-ohmic in order to reduce interaction between macro circuits via the test lines. When the test lines are directly available as external connections, the foregoing can be achieved by grounding the relevant connections. In order to increase the number of test modes of a macro circuit, various series connected control flipflops can be provided for each macro circuit. This may be necessary when a macro circuit itself can assume different states or when a macro circuit comprises a number of inputs and outputs which exceeds the number of available test lines of the test bus.

To those skilled in the art it will be evident that many alternatives are feasible without departing from the scope of the invention. For example, the test bus may consist of one line in order to observe each time one input or one output of a macro circuit for diagnostic purposes. All inputs and outputs of the macro circuits can thus be measured during full operation of the functional circuit. The control flipflops, being coupled so as to form a shift register, can be replaced by other selection means for the selection of macro circuits in the test mode; for example, a ladder network of comparison circuits whose outputs are connected to the coupling means and which is controlled by means of a variable analog voltage can perform a similar selection function. Such a ladder network of comparison circuits is described, for example in the cited manual "Operational Amplifiers", by Greame et al, on pp. 366–368.

I claim:

1. An integrated monolithic circuit having a predetermined internal structure and comprising a functional circuit which is partitioned into at least two macro circuits, each macro circuit having a functional sub-circuit, and test interface circuits which are coupled to the macro circuits, the functional circuit being coupled to external connections and the test interface circuits being coupled to one another, characterized in that the integrated monolithic circuit comprises a test bus which can be coupled to the macro circuits and also comprises coupling means which can be controlled by the test interface circuit in order to couple the test bus to at least one of an input and an output of the macro circuit, the test bus being at least one of coupled to additional external connections and multiplexed with the external connections of the functional circuit.

2. An integrated monolithic circuit as claimed in claim 1, characterized in that the test interface circuits each comprise at least one control flipflop for controlling the coupling means, the control flipflops of the test interface circuits being coupled to one another, the coupled flipflops being connected to a data input and to a clock input which are at least one of connected to further external connections and multiplexed with at least one of the external connections of the functional circuit and the additional external connections.

3. An integrated monolithic circuit as claimed in claim 2, characterized in that the control flipflops are coupled so as to form a shift register circuit, an input of the shift register circuit being connected to the data input and outputs of the shift register circuit being connected to the coupling means.

4. An integrated monolithic circuit as claimed in claim 1, 2 or 3, characterized in that the coupling means comprises switches for switching the at least one of the input and output of the macro circuit to the test bus, the coupling means also comprising switch control means which are coupled to the test interface circuit and the switches.

5. An integrated monolithic circuit as claimed in claim 1, 2 or 3, in which the functional circuit comprises a macro circuit comprising a differential amplifier input stage, characterized in that the coupling means comprises an additional differential amplifier stage with outputs connected in parallel with the differential amplifier input stage, and also comprise a switching device which can be controlled by the test interface circuit and which is inserted in a tail of the differential amplifier stages, which switching device serves to connect the differential amplifier input stage and the additional differential amplifier stage to a part of the macro circuit to be controlled by the differential amplifier input stage, an input of the additional differential amplifier stage being connected to the test bus.

6. An integrated monolithic circuit as claimed in claim 1, 2 or 3, in which the functional circuit comprises a first macro circuit, a current output of which is connected to a current input of a second macro circuit, characterized in that for the coupling of the second macro circuit to the test bus the coupling means for the second macro circuit comprises a current source which is connected to the test bus and which can be connected to the current input by the test interface circuit, the coupling means furthermore comprising a current switch for connecting the current output to the current input in the normal mode and for draining the current from the current output in the test mode.

7. An integrated monolithic circuit as claimed in claim 1, 2 or 3, in which the functional circuit comprises a first macro circuit, a current output of which is connected to a current input of a second macro circuit, characterized in that for the coupling of the first macro circuit to the test bus the coupling means for the first macro circuit comprises a current switch which is connected to the test bus and which can be controlled by the test interface circuit in order to connect the current output to the current input in the normal mode and to connect the current output to the test bus in the test mode.

8. An integrated monolithic circuit as claimed in claim 2 or 3, characterized in that the test interface circuit comprises an enable circuit having an input which is connected to an output of the control flipflop and an enable input which is connected to an output of a comparison circuit which is common to the test interface circuits and which comprises a reference input for the supply of a reference signal and an input which is connected to the clock input for the supply of a trivalent clock signal, an output of the enable circuit being connected to the coupling means in order to enable the coupling means.

9. An integrated monolithic circuit as claimed in claim 1, 2 or 3, in which at least one of the macro circuits is a digital circuit, characterized in that in the test mode the coupling means are controlled so that sequential logic circuits of the digital circuit are connected in series and combinatory logic circuits of the digital circuits are connected in an input/output relation with the sequential logic circuits, the series connection comprising a data input for the supply of data and a data output for the output of data to and from the digital circuit, the data input and the data output being connected to the test bus.

* * * * *